US008908383B1

(12) United States Patent
Railkar et al.

(10) Patent No.: US 8,908,383 B1
(45) Date of Patent: Dec. 9, 2014

(54) THERMAL VIA STRUCTURES WITH SURFACE FEATURES

(75) Inventors: Tarak A. Railkar, Plano, TX (US); Paul D. Bantz, Los Altos, CA (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 156 days.

(21) Appl. No.: 13/476,923

(22) Filed: May 21, 2012

(51) Int. Cl.
| H05K 7/02 | (2006.01) |
| H05K 7/06 | (2006.01) |
| H05K 7/08 | (2006.01) |
| H05K 7/10 | (2006.01) |

(52) U.S. Cl.
USPC .......... 361/760; 361/704; 361/707; 361/763; 361/764; 361/767; 361/772; 361/774

(58) Field of Classification Search
USPC ................. 361/700–710, 764, 772–774, 767; 174/250–264
See application file for complete search history.

(56) References Cited

U.S. PATENT DOCUMENTS

| 5,506,755 | A | | 4/1996 | Miyagi et al. | |
| 6,124,643 | A | * | 9/2000 | Brand | 257/787 |
| 7,505,275 | B2 | | 3/2009 | Reis et al. | |
| 2002/0172025 | A1 | * | 11/2002 | Megahed et al. | 361/767 |
| 2005/0254215 | A1 | * | 11/2005 | Khbeis et al. | 361/704 |
| 2009/0146295 | A1 | * | 6/2009 | Narita et al. | 257/720 |
| 2009/0195334 | A1 | * | 8/2009 | Goi et al. | 333/203 |
| 2009/0273002 | A1 | * | 11/2009 | Chiou et al. | 257/99 |
| 2009/0278162 | A1 | * | 11/2009 | Wang et al. | 257/99 |
| 2012/0007132 | A1 | * | 1/2012 | Chang et al. | 257/99 |

* cited by examiner

*Primary Examiner* — Tuan T Dinh
(74) *Attorney, Agent, or Firm* — Schwabe Williamson & Wyatt

(57) ABSTRACT

Embodiments of the present disclosure describe apparatuses, methods, and systems of thermal via structures with surface features. In some embodiments the surface features may have dimensions greater than approximately one micron. The thermal via structures may be incorporated into a substrate of an integrated circuit device. Other embodiments may be described and/or claimed.

19 Claims, 5 Drawing Sheets

THERMAL VIA STRUCTURES WITH SURFACE FEATURES

FIELD

Embodiments of the present disclosure generally relate to the field of integrated circuits, and more particularly, to a substrate having thermal via structures with surface features.

BACKGROUND

High power microelectronic packages dissipate large densities of thermal energy. An array of thermal vias may be used to provide a thermal channel through a substrate to direct thermal energy away from an operating electronic device. Via-bar structures, similar to thermal vias yet having a greater heat-conducting cross-sectional area, have been increasingly used to reduce thermal resistances in the thermal channel as compared to thermal vias. However, conventional via-bar structures may be associated with package stress and, therefore, reduced device reliability.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure provide a substrate having thermal via structures with defined surface features. These thermal via structures facilitate substrate reliability and further facilitate the presence of a robust thermal channel that has low thermal resistances allowing thermal energy to be transferred away from an operating electronic device. Methods of manufacturing a substrate having such thermal via structures are also disclosed.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

Figure 1:
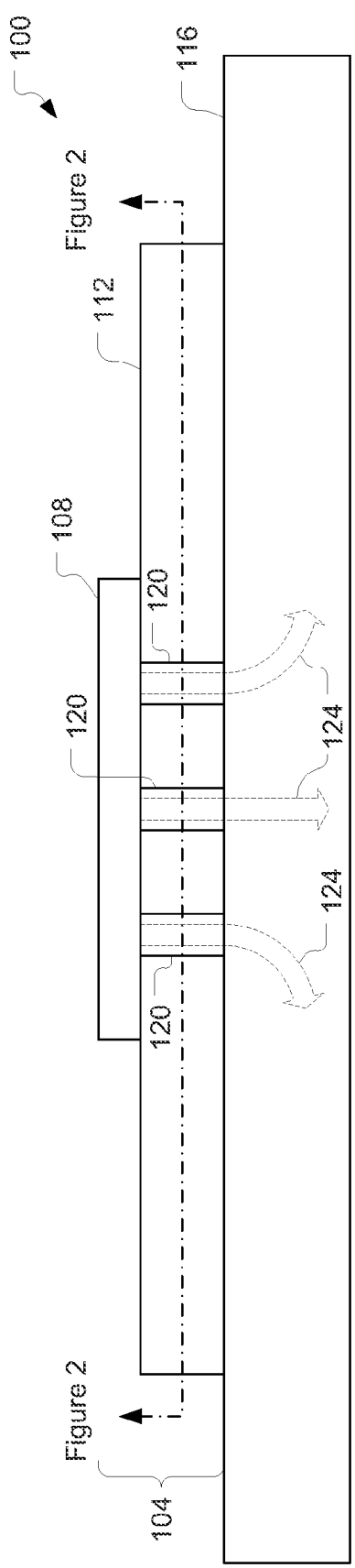
FIG. 1 illustrates a cross-section view of an integrated circuit (IC) device according to various embodiments.

FIG. 1 illustrates a cross-section view of an integrated circuit (IC) device 100 according to various embodiments. The IC device 100 may include a microelectronic package (hereinafter "package") 104 that has an electronic component 108, e.g., a semiconductor die, coupled with a substrate 112. The package 104 may be a ball grid array (BGA) package, a micro leadframe package, a chip-scale package (CSP), a system in package (SIP), etc. The package 104 may be coupled with a board 116.

The electronic component 108 may be composed of any of a variety of semiconductor materials having integrated circuits fabricated therein. In some embodiments, the electronic component 108 may be a monolithic microwave integrated circuit (MMIC) including, e.g., field effect transistors, and fabricated within a III-V compound semiconductor material such as, but not limited to gallium arsenide (GaAs) or gallium nitride (GaN). In other embodiments, the electronic component 108 may include other types of integrated circuits and/or semiconductor materials.

The substrate 112 may provide the electronic component 108 with mechanical support and may facilitate electrical coupling of the electronic component 108 with other components. In various embodiments, the substrate 112 may provide the electronic component 108 with signal, ground, and/or power connections.

The substrate may be a laminate substrate that includes, e.g., an epoxy-based laminate (e.g., FR4) or a resin-based laminate (e.g., bismaleimide-triazine (BT) resin laminate). In other embodiments, the substrate 112 may be constructed of ceramic or other types of material.

In some embodiments, the board 116 may be, e.g., a printed circuit board (PCB). The board 116 may provide the package 104 with mechanical support and may facilitate electrical coupling of the package 104 with other components including other packages and/or components mounted on the board 116 or disposed elsewhere in a system hosting the IC device 100. In various embodiments, the board 116 may provide the electronic component 108 with signal, ground, and/or power connections.

The electronic component 108, substrate 112, and board 116 may be coupled with one another by any of a variety of coupling mechanisms. The coupling mechanisms could include, but are not limited to, screws, clamps, rivets, solder layers, solder balls, etc.

In some embodiments, a thermal interface material (TIM) may be disposed between adjacent components, e.g., between the substrate 112 and board 116, to facilitate thermal conductivity between the adjacent components. The TIM may include, but is not limited to, a thermal grease, a thermally-conductive gel pad, or a shim, e.g., an indium shim.

The substrate 112 may include thermal via structures 120 that are designed to provide a low thermal resistance path from a top surface of the substrate 112, e.g., surface with which the electronic component 108 is coupled, to a bottom surface of the substrate 112, e.g., surface with which the board 116 is coupled. During operation, heat sourced from the electronic component 108 may be transferred through the thermal via structures 120 of the substrate 112 into the board 116 as shown by arrows 124. Providing effective heat transfer through the thermal via structures 120 from the electronic component 108 to the board 116 may facilitate dissipation of large densities of thermal energy sourced by operation of the electronic component 108.

In various embodiments, the thermal via structures 120 may be constructed of a thermally-conductive material such as, but not limited to, copper, a thermally-conductive epoxy, silver, etc.

In some embodiments, the thermal via structures 120 may also be electrically conductive and may be used to provide power and/or ground for the electronic component 108.

Figure 2:
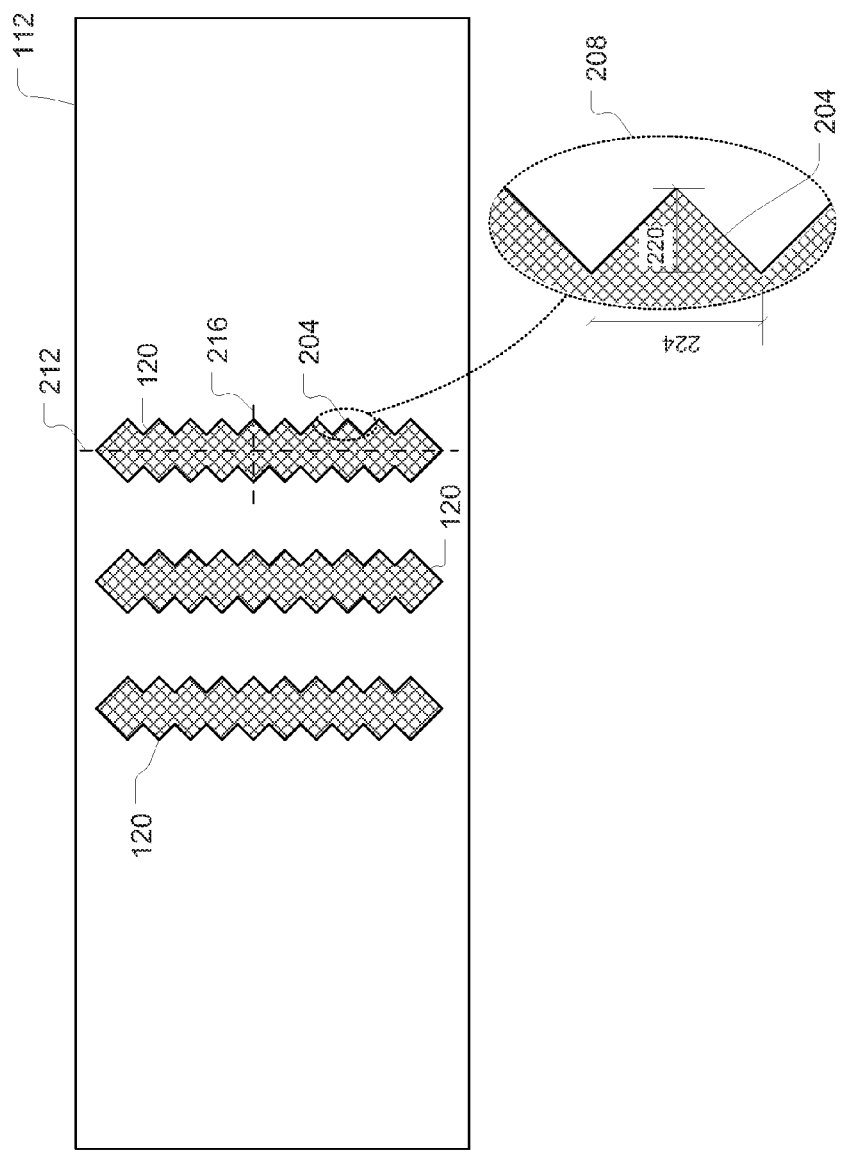
FIG. 2 illustrates a top-down view of the substrate of FIG. 1 according to various embodiments.

FIG. 2 illustrates a top-down view of the substrate 112 in accordance with various embodiments. The thermal via structures 120, as shown in FIG. 2, include surface features 204. Callout 208 illustrates a magnified surface feature 204 for ease of description.

The thermal via structures 120 are shown with a major dimension 212 and an orthogonal minor dimension 216. A length of a thermal via structure 120 may be measured along its major dimension 212, while a width of the thermal via structure 120 may be measured along its minor dimension 216. In some embodiments, the width may be 125 microns, and the length may be between approximately 125 microns to 1 millimeter. In the event the width is equal to the length, the thermal via structure 120 may have a generally circular shape.

The surface features 204 may each have a dimension 220, which is parallel with the minor dimension 216 of the thermal via structure, and a dimension 224, which is parallel with the major dimension 212. The dimension 220 may be in a range of approximately 1-30 microns in some embodiments, while the dimension 224 may be in a range of approximately 1-60 microns. In some embodiments, a particularly effective range may be greater than approximately 10 microns for dimension 220 and greater than approximately 20 microns for dimension 224.

While specific dimensions or ranges are provided herein, e.g., for the thermal via structures 120 and the surface features 204, other embodiments may have other dimensions or ranges.

Providing surface features 204, e.g., with dimensions described above, may provide a locking mechanism between the thermal via structure 120 and an interior cavity surface of the substrate 112. The locking mechanism may, in turn, provide the substrate 112 with mechanical stability to better withstand stresses that may be caused, e.g., by thermal cycling of the IC device 100 during operation.

The locking mechanism may further enable the length and/or width of the thermal via structures 120 to be increased beyond that of convention thermal via bars. This may improve thermal transfer characteristics of the thermal via structures 120 and/or may provide for improved electrical characteristics with respect to the power/ground interface provided to the electronic component 108 by the thermal via structures 120.

In some embodiments, the surface features 204 of the thermal via structures 120 may be tailored to meet specific requirements of the substrate 112. For example, a device may include surface features 204 having different shapes and/or dimensions depending on what portion of the thermal via structure 120 they are situated.

While the above-embodiments describe the thermal via structures 120 as being located in the substrate 112, other embodiments may include thermal via structures alternatively/additional disposed in other components. For example, in some embodiments, thermal via structures may be included in the electronic component 108, the board 116, and/or another component, e.g., heat sink. The dimensions of the thermal via structure and surface features may be proportionally adjusted in order to meet specific objectives of the environment in which they are disposed.

Figure 3A:
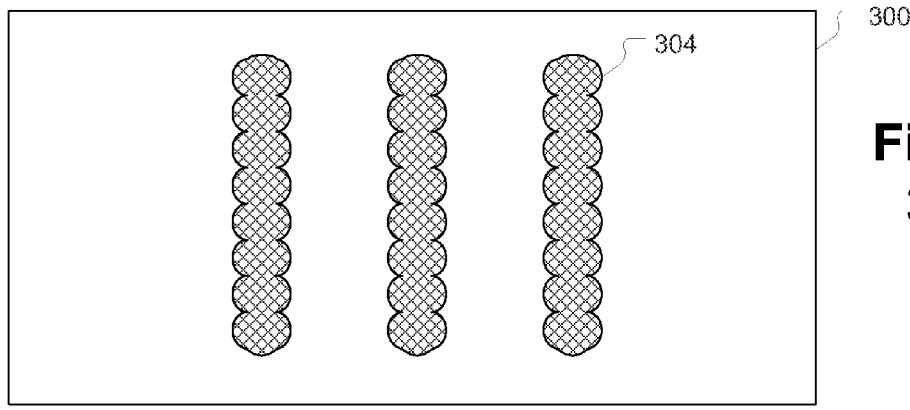
FIGS. 3(a)-3(c) illustrate top-down views of substrates according to various embodiments.
Figure 3B:
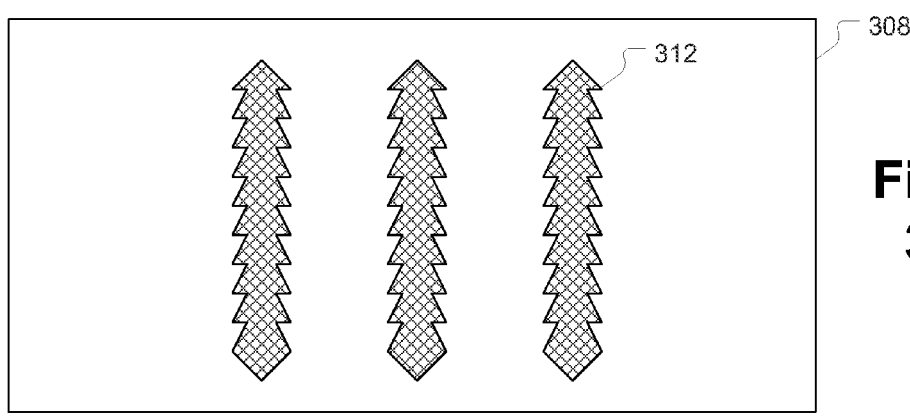
Figure 3C:
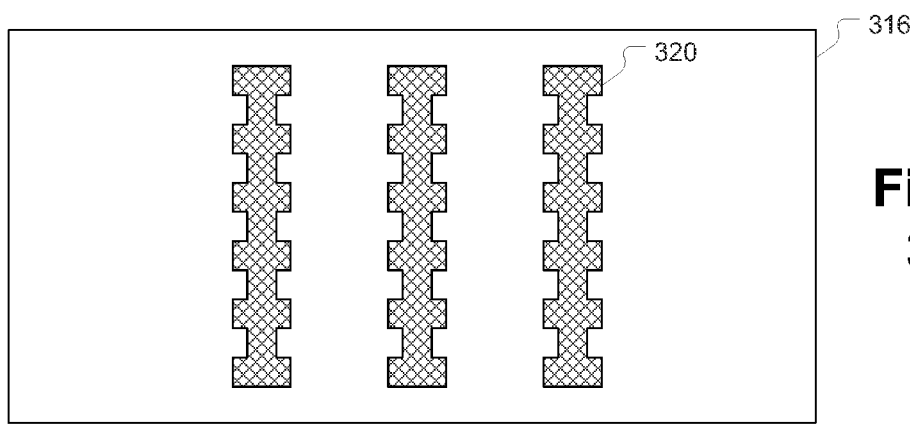

The surface features 204 are shown with a triangle-shaped pattern in FIG. 2. However, in other embodiments, surface features may be arranged in other patterns. FIGS. 3(a)-3(c) illustrate top-down views of substrates having thermal via structures with various patterns in accordance with some embodiments. In particular, FIG. 3(a) illustrates a cross-section view of substrate 300 having thermal via structures 304 with arc-shaped patterns. FIG. 3(b) illustrates a top-down view of a substrate 308 having thermal via structures 312 with sawtooth-shaped patterns. FIG. 3(c) illustrates a top-down view of a substrate 316 having thermal via structures 320 with square-shaped patterns. Surface features of each of these thermal via structures may include dimensions that are similar to the surface-feature dimensions discussed above.

The substrates 300, 308, 316 may be interchangeable with substrate 112.

Figure 4:
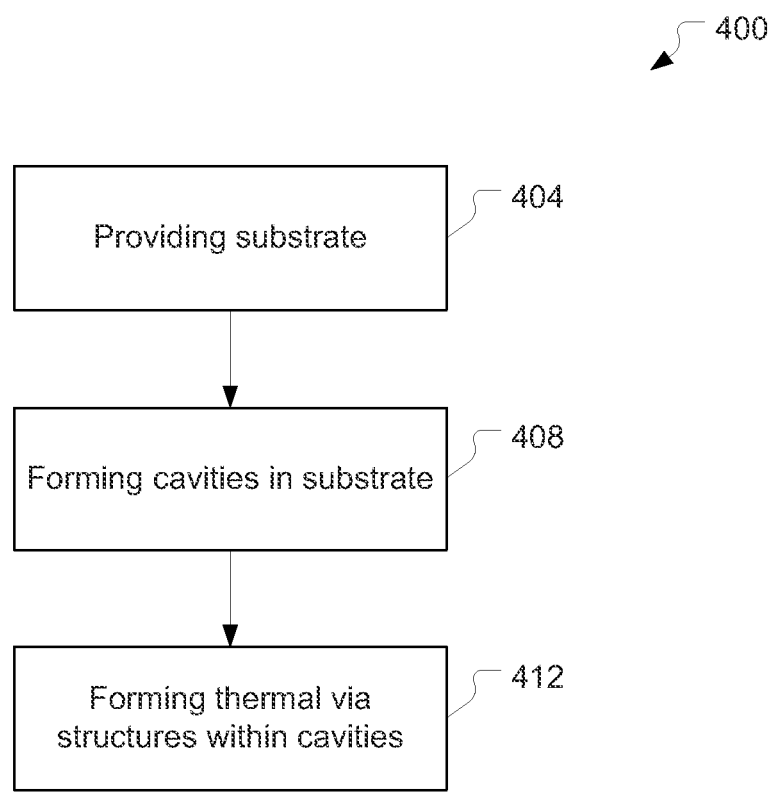
FIG. 4 is a flow diagram of a method for fabricating a substrate according to various embodiments.

FIG. 4 is a flowchart depicting a manufacturing operation 400 in accordance with some embodiments. The manufacturing operation 400 may be used to construct substrate 100, 300, 308, or 316.

The manufacturing operation 400 may include, at block 404, providing a substrate. The provided substrate may be manufactured by various manufacturing operations such as, but not limited to, patterning, depositing, laminating, planarizing, etc. In some embodiments, various electrical connections may be formed in the provided substrate.

The manufacturing operation 400 may include, at block 408, forming cavities in the substrate. The cavities may be formed in the substrate through various manufacturing operations such as, but not limited to, laser drilling, mechanical drilling, etching, photoresist, punching, etc. The cavities may be provided with a shape that is to define the thermal via structures.

The manufacturing operation 400 may include, at block 412, forming the thermal via structures within the cavities of the substrate. The thermal via structures may be formed by providing thermally-conductive material in the cavities through any of various manufacturing operations including, but not limited to, plating, printing, depositing, etc.

In addition to increasing the mechanical robustness of the substrate, the shape of the surface features may assist with the efficiency of forming the thermal via structures. For example, the edges of the cavities may increase surface tension, which may, in turn facilitate a plating process by, e.g., reducing the number of plating/grinding runs used. This may result in less material, e.g., copper, being used in the plating process and it may also decrease an amount of time required to form the thermal via structures. The increased surface tension provided by the edges of the cavities may also facilitate formation of larger thermal via structures, both in terms of length and width.

Figure 5:
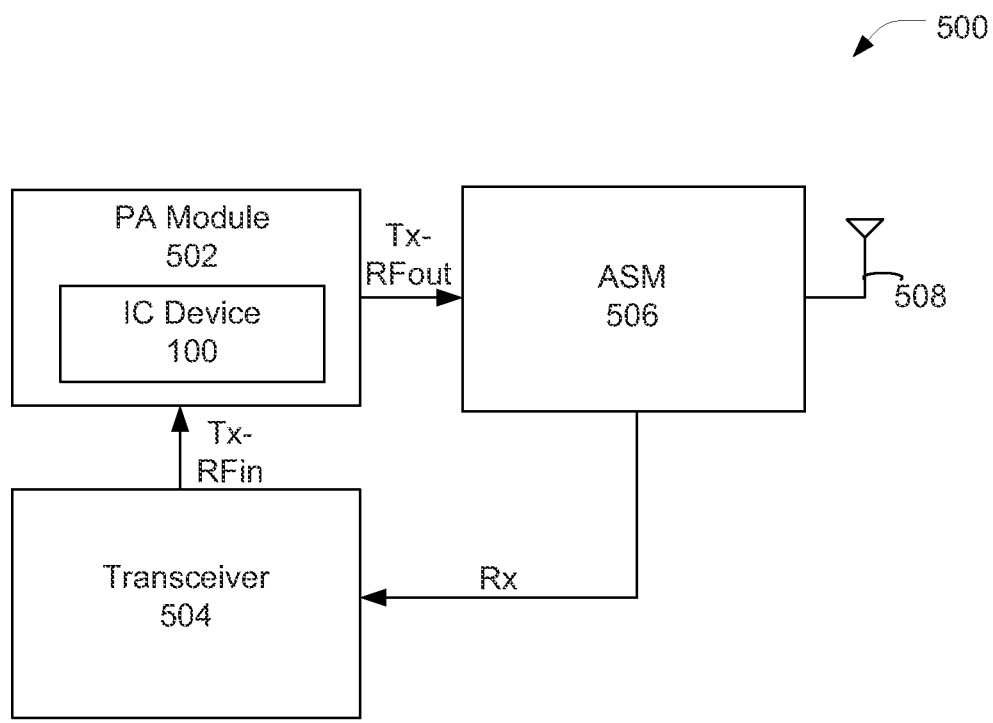
FIG. 5 illustrates an example system including an IC device according to various embodiments.

Embodiments of an IC device (e.g., the IC device 100) described herein, and apparatuses including such an IC device may be incorporated into various other apparatuses and systems. A block diagram of an example system 500 is illustrated in FIG. 5. As illustrated, the system 500 includes a power amplifier (PA) module 502, which may be a radio frequency (RF) PA module in some embodiments. The system 500 may include a transceiver 504 coupled with the PA module 502 as illustrated. The PA module 502 may include an IC device (e.g., the IC device 100) to perform any of a variety of operations such as amplification, switching, mixing, etc. In various embodiments, an IC device (e.g., IC device 100) may additionally/alternatively be included in the transceiver 504 to provide, e.g., up-converting.

The PA module 502 may receive an RF input signal, RFin, from the transceiver 504. The PA module 502 may amplify the RF input signal, RFin, to provide the RF output signal, RFout. The RF input signal, RFin, and the RF output signal, RFout, may both be part of a transmit chain, respectively noted by Tx-RFin and Tx-RFout in FIG. 5.

The amplified RF output signal, RFout, may be provided to an antenna switch module (ASM) 506, which effectuates an over-the-air (OTA) transmission of the RF output signal, RFout, via an antenna structure 508. The ASM 506 may also receive RF signals via the antenna structure 508 and couple the received RF signals, Rx, to the transceiver 504 along a receive chain.

In various embodiments, the antenna structure 508 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 500 may be any system including power amplification. In various embodiments, inclusion of thermally-efficient IC device 100 in the system 500 may be particularly useful when the system 500 is used for power amplification at high RF power and frequency. For example, the system 500 may be suitable for any one or more of terrestrial and satellite communications, radar systems, and possibly in various industrial and medical applications. More specifically, in various embodiments, the system 500 may be a selected one of a radar device, a satellite communication device, a mobile computing device (e.g., a phone, a tablet, a laptop, etc.), a base station, a broadcast radio, or a television amplifier system.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An apparatus comprising:
a substrate comprising a first surface and a second surface opposite the first surface;
an electronic component coupled with the first surface of the substrate;
a circuit board coupled with the second surface of the substrate; and
a thermal via structure disposed in the substrate, the thermal via structure including a thermally conductive material that includes surface features on the first surface and the second surface and arranged in a pattern of two or more partially overlapping shapes, the surface features having dimensions greater than approximately 1 micron, wherein the surface features on the first surface are in direct contact with the electronic component and configured to transfer heat sourced from the electronic component when operating to the circuit board.

2. The apparatus of claim 1, wherein the pattern comprises two or more partially overlapping square shapes.

3. The apparatus of claim 1, wherein the pattern comprises two or more partially overlapping triangle shapes.

4. The apparatus of claim 1, wherein the pattern comprises two or more partially overlapping sawtooth shapes.

5. The apparatus of claim 1, wherein the pattern comprises two or more partially overlapping arc shapes.

6. The apparatus of claim 1, wherein the thermal via structure comprises a minor cross-sectional dimension and the dimensions of the features are parallel with the minor cross-sectional dimension.

7. The apparatus of claim 1, wherein the thermal via structure comprises copper, silver, or a thermally-conductive epoxy.

8. The apparatus of claim 1, wherein the thermal via structure further comprises:
a side surface located between the first surface and the second surface, wherein the surface features are integrated into the side surface of the thermal via structure.

9. The apparatus of claim 6, wherein the dimensions are first dimensions and the thermal via structure further comprises a major cross-sectional dimension, and the features further include second dimensions that are parallel to the major cross-sectional dimension.

10. The apparatus of claim 9, wherein the first dimensions are in a range of approximately 1-30 microns.

11. The apparatus of claim 9, wherein the first dimensions are greater than approximately 10 microns and the second dimensions are greater than approximately 20 microns.

12. The apparatus of claim 10, wherein the second dimensions are in a range of approximately 1-60 microns.

13. A method comprising:
providing a substrate comprising a first surface and a second surface opposite the first surface;
coupling an electronic component with the first surface of the substrate;
coupling a circuit board with the second surface of the substrate;
forming a cavity in the substrate, the cavity having a pattern of two or more partially overlapping shapes; and
forming a thermal via structure within the cavity, wherein the thermal via structure is formed with surface features on the first surface of the substrate and the second surface of the substrate, the surface features on the first surface arranged in the pattern and having dimensions greater than approximately 1 micron, wherein the surface features on the first surface are in direct contact with the electronic component and configured to transfer heat sourced from the electronic component when operating to the circuit board.

14. The method of claim 13, wherein forming the thermal via structure further comprises:
plating copper in the cavity.

15. The method of claim 13, wherein forming the cavity comprises:
forming the cavity by laser drilling, mechanical drilling, etching, photoresist, or punching.

16. The method of claim 13, wherein the two or more partially overlapping shapes include two or more partially overlapping arc shapes, square shapes, sawtooth shapes, or triangle shapes.

17. A system comprising:

a transceiver configured to provide a radio frequency (RF) signal;

a power amplification module configured to receive the RF signal from the transceiver and amplify the RF signal for an over-the-air transmission; and an integrated circuit (IC) device, disposed in the transceiver or in the PA module, the IC device including;
- a substrate comprising a first surface and a second surface opposite the first surface;
- an electronic component coupled with the first surface of the substrate;
- a circuit board coupled with the second surface of the substrate; and
- a thermal via structure disposed in the substrate, the thermal via structure including a thermally conductive material that includes surface features on the first surface and the second surface and arranged in a pattern of two or more partially overlapping shapes, the surface features having dimensions greater than approximately 1 micron, wherein the surface features on the first surface are in direct contact with the electronic component and configured to transfer heat sourced from the electronic component when operating to the circuit board.

18. The system of claim 17, wherein the surface features include dimensions greater than approximately 1 micron.

19. The system of claim 17, wherein the dimensions are greater than approximately 10 microns.

* * * * *